United States Patent
Hwang et al.

(10) Patent No.: US 9,356,592 B2
(45) Date of Patent: May 31, 2016

(54) METHOD OF REDUCING CURRENT COLLAPSE OF POWER DEVICE

(71) Applicant: Samsung Electronics Co., Ltd., Suwon-si, Gyeonggi-Do (KR)

(72) Inventors: In-jun Hwang, Hwaseong-si (KR); Jong-seob Kim, Hwaseong-si (KR); Soo-Gine Chong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 138 days.

(21) Appl. No.: 13/973,379

(22) Filed: Aug. 22, 2013

(65) Prior Publication Data

US 2014/0266400 A1     Sep. 18, 2014

(30) Foreign Application Priority Data

Mar. 14, 2013   (KR) .................. 10-2013-0027493

(51) Int. Cl.
*H03K 17/687*   (2006.01)
*H03K 17/06*    (2006.01)
*H03K 17/16*    (2006.01)

(52) U.S. Cl.
CPC ............ *H03K 17/063* (2013.01); *H03K 17/161* (2013.01)

(58) Field of Classification Search
USPC ........................................................ 327/429
See application file for complete search history.

(56) References Cited

U.S. PATENT DOCUMENTS

| | | |
|---|---|---|
| 7,161,194 B2 | 1/2007 | Parikh et al. |
| 7,696,535 B2 | 4/2010 | Yang et al. |
| 7,800,132 B2 * | 9/2010 | Smorchkova et al. ........ 257/194 |
| 7,948,220 B2 * | 5/2011 | Bahramian ................... 323/224 |
| 2004/0119107 A1 * | 6/2004 | Hisamoto et al. ............. 257/314 |
| 2004/0155234 A1 * | 8/2004 | Ishimaru et al. ................ 257/10 |
| 2007/0153587 A1 * | 7/2007 | Lue .................... G11C 16/0466 365/185.29 |
| 2011/0193096 A1 * | 8/2011 | Imada ............................. 257/76 |
| 2011/0215858 A1 * | 9/2011 | Mauder et al. ................ 327/377 |
| 2012/0049270 A1 * | 3/2012 | Hirler et al. ................... 257/328 |
| 2012/0175680 A1 * | 7/2012 | Suh et al. ...................... 257/194 |
| 2014/0130968 A1 * | 5/2014 | Hung ................... G02B 5/3016 156/247 |

FOREIGN PATENT DOCUMENTS

| | | |
|---|---|---|
| JP | 08-255898 | 10/1996 |
| JP | 2000-003919 A | 1/2000 |
| JP | 2008-130672 | 6/2008 |
| JP | 2011-151176 A | 8/2011 |

OTHER PUBLICATIONS

Ikeda, Nariaki, et al. "High Power GaN HFETs on Si Substrate". Furukawa Review, No. 34. 2008. pp. 17-23.

* cited by examiner

*Primary Examiner* — Lincoln Donovan
*Assistant Examiner* — Patrick Chen
(74) *Attorney, Agent, or Firm* — Harness, Dickey & Pierce, P.L.C.

(57) ABSTRACT

According to example embodiments, a method of operating a power device includes applying a control voltage to a control electrode of the power device, where the control electrode is electrically separated from a source electrode, a drain electrode, and a gate electrode of the power device. The control voltage is separately applied to the control electrode. The method may include applying a negative control voltage to the control electrode prior to applying a gate voltage to the gate electrode.

7 Claims, 3 Drawing Sheets

METHOD OF REDUCING CURRENT COLLAPSE OF POWER DEVICE

CROSS-REFERENCE TO RELATED APPLICATIONS

This application claims priority under 35 U.S.C. §119 to Korean Patent Application No. 10-2013-0027493, filed on Mar. 14, 2013, in the Korean Intellectual Property Office, the disclosure of which is incorporated herein in its entirety by reference.

BACKGROUND

1. Field

The present disclosure relates to methods of operating a power device to reduce current collapse that occurs by trapping electrons of a channel in a semiconductor layer when the power device is transformed from an off-state to an on-state.

2. Description of Related Art

A high electron mobility transistor (HEMT) is one type of power device. The HEMT includes compound semiconductors having polarizabilities different from each other, and a 2-dimensional electron gas (2DEG) that is used as a carrier is formed in a channel layer. In an HEMT, when turning off the HEMT, a high voltage may be applied to a drain electrode, and thus, electrons from a gate electrode may be trapped in a channel supply layer near the drain electrode or a surface of the channel supply layer near the drain electrode. Also, hot electrons of a channel may be trapped in the channel supply layer.

When a HEMT is turned from an off-state to an on-state, the trapped electrons may be unable to escape from where they are trapped, and thus, a portion of regions of the channel may be depleted. As a result, on-resistance may increase, and accordingly, current collapse may occur. Due to current collapse, resistance in the HEMT may increase, heat generation may increase, and degradation of the HEMT may be accelerated.

In order to reduce the current collapse, using a field plate or forming of a protective layer on the gate electrode has been attempted.

SUMMARY

Example embodiments relate to methods of operating a power device to reduce current collapse when the power device is turned over from an off-state to an on-state.

Additional aspects will be set forth in part in the description which follows and, in part, will be apparent from the description, or may be learned by practice of example embodiments.

According to example embodiments, a method of operating a power device to reduce a current collapse that due to electrons trapped in a channel supply layer when the power device is changed to a turned-on state from a turned-off state, includes: applying a control voltage to a control electrode of the power device, the control electrode being electrically separated from a source electrode, a drain electrode, and a gate electrode of the power device, the control voltage being separately applied to the control electrode.

In example embodiments, the method may include applying a gate voltage to the gate electrode, and the applying the control voltage to the control electrode may include detrapping the electrons trapped in the channel supply layer by applying a negative control voltage to the control electrode.

In example embodiments, the applying the negative control voltage may be performed prior to the applying the gate voltage.

In example embodiments, a range negative control voltage may be from about −5V to about −20V.

In example embodiments, the method may further include: applying a bias voltage in a range from about 0V to about −20V to the control electrode when the power device is in the turned-off state. An absolute value of the bias voltage may be smaller than an absolute value of the negative control voltage.

In example embodiments, the control electrode may be between the gate electrode and the drain electrode.

In example embodiments, the power device may include a channel layer, the channel supply layer may be on the channel layer, and the control electrode may be at a lower side of the channel layer and face the gate electrode.

In example embodiments, the method may further include: applying a gate voltage to the gate electrode, wherein applying the control voltage may include forming electrons on a lower side of the control electrode by applying a positive control voltage to the control electrode when the gate voltage is applied to the gate electrode.

In example embodiments, the applying the gate voltage and the applying the positive control voltage may be performed at a same time.

In example embodiments, the applying the control voltage may include: applying a negative control voltage to the control electrode prior to the applying of the gate voltage to the gate electrode; and applying a positive control voltage to the control electrode when the gate voltage is applied to the gate electrode.

In example embodiments, the applying the negative control voltage and the applying the positive control voltage may be consecutively performed.

BRIEF DESCRIPTION OF THE DRAWINGS

These and/or other aspects will become apparent and more readily appreciated from the following description of non-limiting embodiments, taken in conjunction with the accompanying drawings in which like reference characters refer to the same parts throughout the different views. The drawings are not necessarily to scale, emphasis instead being placed upon illustrating principles of inventive concepts. In the drawings.

DETAILED DESCRIPTION

Figure 1:
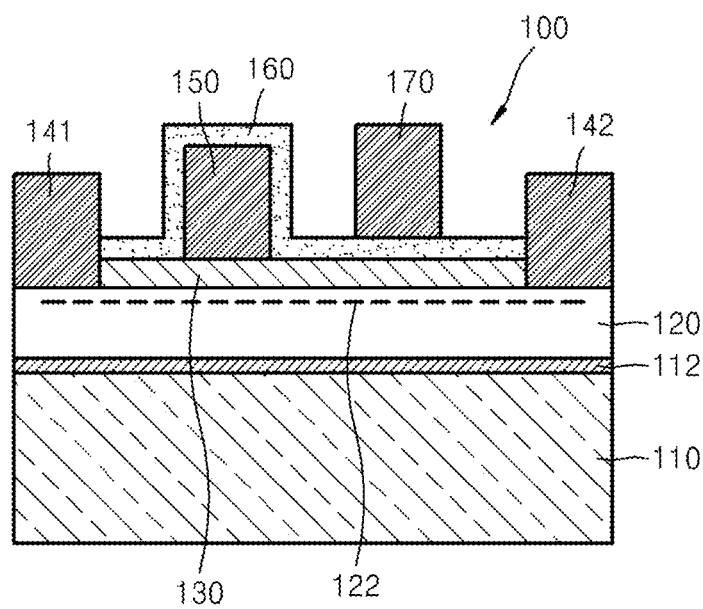
FIG. 1 is a schematic cross-sectional view showing a structure of a power device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view showing a structure of a power device 100 according to example embodiments.

Referring to FIG. 1, a buffer layer 112 is formed on a substrate 110. The substrate 110 may include sapphire, Si, SiC, or GaN. However, these materials are examples, and the substrate 110 may be formed of various materials.

The buffer layer 112 may be a compound semiconductor. For example, the buffer layer 112 may be formed of a GaN layer, an AlGaN layer, or an AlGaInN layer. A seed layer (not shown) may be further included between the substrate 110 and the buffer layer 112. The seed layer may be, for example, an AlN layer or an AlGaN layer.

A channel layer 120 that includes a 2-dimensional electron gas (2DEG) may be formed on the buffer layer 112. The 2DEG 122 may be located below an upper surface of the channel layer 120. The 2DEG 122 may be used as an electron path.

The channel layer 120 may be formed of a first nitride semiconductor material. The first nitride semiconductor material may be a Group III-V compound semiconductor. For example, the channel layer 120 may be a GaN group material layer, and more specifically, may be a GaN layer. In this case, the channel layer 120 may be an undoped GaN layer, and in some cases, may be a GaN layer doped with a desired (and/or alternatively predetermined) impurity.

A channel supply layer 130 is formed on the channel layer 120. The channel supply layer 130 may cause the 2DEG 122 in the channel layer 120. The 2DEG 122 may be formed in the channel layer 120 below an interface between the channel layer 120 and the channel supply layer 130. The channel supply layer 130 may be formed of a second nitride semiconductor material that is different from the first nitride semiconductor material. The second nitride semiconductor material may be different from the first nitride semiconductor material with respect to at least one of a polarization characteristic, an energy band gap, and a lattice constant. More specifically, at least one of the polarizability and the energy band gap of the second nitride semiconductor material may be greater than that of the first nitride semiconductor material.

The channel supply layer 130 may be formed of a nitride material that includes at least one of Al, Ga, In, and B, and may have a single layer or multilayer structure. As more specific examples, the channel supply layer 130 may be formed of AlGaN, AlInN, InGaN, AlN, or AlInGaN. The channel supply layer 130 may be an undoped layer, but may be a layer doped with an n-type dopant. Silicon may be used as an n-type dopant, but example embodiments are not limited thereto.

The channel supply layer 130 may have a thickness of, for example, less than a few tens of nm. For example, the thickness of the channel supply layer 130 may be approximately less than 50 nm, but example embodiments are not limited thereto.

A source electrode 141 and a drain electrode 142 may be formed on both sides of the channel supply layer 130 on the channel layer 120. The source electrode 141 and the drain electrode 142 may contact the channel supply layer 130.

A gate electrode 150 is formed on the channel supply layer 130. The gate electrode 150 may be formed closer to the source electrode 141 than the drain electrode 142.

A protective layer 160 covering the gate electrode 150 may be formed on the channel supply layer 130. The protective layer 160 may be formed of silicon nitride or aluminum nitride. The protective layer 160 may provide an effect of reducing a current collapse.

A control electrode 170 may be formed between the gate electrode 150 and the drain electrode 142 on the protective layer 160. The control electrode 170 may be formed of a general electrode material. The control electrode 170 is electrically separated from the source electrode 141, the drain electrode 142, and the gate electrode 150. A control voltage may be separately applied to the control electrode 170 than voltages applied to the source electrode 141, the drain electrode 142, and the gate electrode 150.

The source electrode 141, the drain electrode 142, the gate electrode 150, and the control electrode 170 may include at least one metal or a metal nitride. For example, the source electrode 141, the drain electrode 142, the gate electrode 150, and the control electrode 170 may include at least one of Au, Ni, Pt, Ti, Al, Pd, Ir, W, Mo, Ta, Cu, TiN, TaN, and WN.

Figure 2:
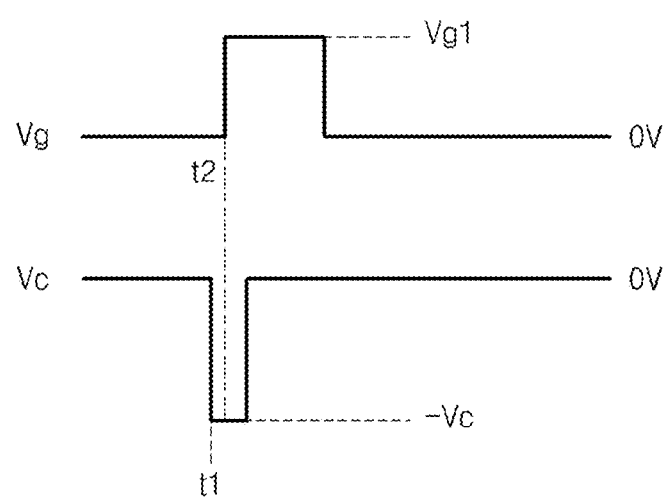
FIGS. 2 through 5 are timing diagrams showing methods of operating a power device to reduce current collapse, according to example embodiments.

FIG. 2 is a timing diagram showing a method of operating the power device 100 of FIG. 1 to reduce current collapse thereof, according to example embodiments.

Referring to FIG. 2, in a power system that includes the power device 100, in a state when the power device 100 is turned off, a high voltage, for example, a few hundred to a few thousand volts may be hanged on the drain electrode 142. Accordingly, electrons from the gate electrode 150 may be trapped in the channel supply layer 130 near the drain electrode 142 or at an interface between the protective layer 160 and the channel supply layer 130. Also, hot electrons from the channel may be trapped in the channel supply layer 130. Due to the trapped electrons, current collapse may occur when the power device 100 is turned on.

A negative control voltage −Vc is applied to the control electrode 170 at a point of time t1 before turning on the power device 100 by applying a gate turn-on voltage Vg1 to the gate electrode 150 of the power device 100. The negative control voltage −Vc that is applied to the control electrode 170 moves electrons trapped in the channel supply layer 130 to a region of the channel layer 120, in particular to the 2DEG 122 where the electrons are depleted. This process may be referred to as a detrap process.

The gate turn-on voltage Vg1 may be referred to as a gate voltage Vg1 below. The gate voltage Vg1 may be in a range from about 10 V to about 12 V, and the negative control voltage −Vc may be in a range from about −5 V to about −20 V.

Next, when the gate voltage Vg1 is applied to the gate electrode 150, the power device 100 is turned-on without current collapse (and/or with reduced current collapse).

In example embodiments, the point of time t1 of applying the negative control voltage −Vc may be earlier than a point of time t2 of applying the gate voltage Vg1. However, example embodiments are not limited thereto, for example, the point of time t2 of applying the gate voltage Vg1 and the point of time t1 of applying the negative control voltage −Vc may be coincident, or the point of time t2 of applying the gate voltage Vg1 may be later than the point of time t1 of applying the negative control voltage −Vc.

Figure 3:
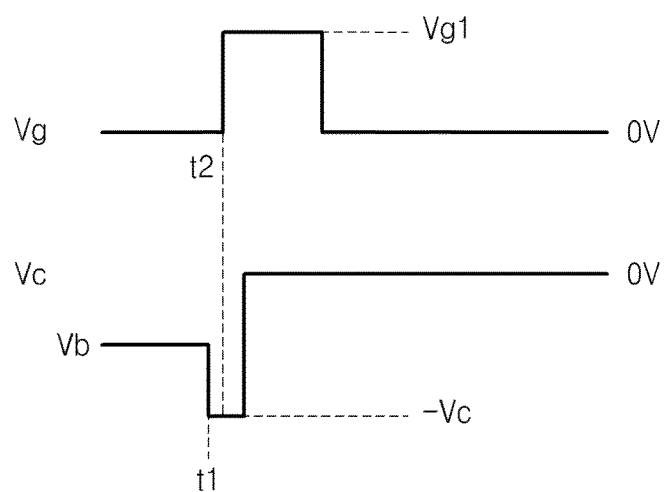

FIG. 3 is a timing diagram showing a method of operating the power device 100 of FIG. 1 to reduce current collapse thereof, according to example embodiments.

Referring to FIG. 3, a bias voltage Vb in a range from about 0 V to about −20 V is applied to the control electrode 170 when the power device 100 is in a turned-off state. The application of the bias voltage may limit (and/or repress) the trapping of electrons of the gate electrode 150 in the channel supply layer 130 near the drain electrode 142 or in an interface between the protective layer 160 and the channel supply layer 130, and also, limit (and/or repress) the trapping of hot electrons of the channel in the channel supply layer 130.

Next, a negative control voltage −Vc is applied to the control electrode 170 at a point of time t1 before turning on the power device 100 by applying a gate voltage Vg1 to the gate electrode 150. The negative control voltage −Vc that is applied to the control electrode 170 moves electrons trapped in the channel supply layer 130 to a region of the channel layer 120, in particular, to the 2DEG 122 where the electrons are depleted. This process may be referred to as a detrap process. The gate voltage Vg1 may be in a range from about 10 V to about 12V, and the negative control voltage −Vc may be in a range from about −5 V to about −20V. An absolute value of the negative control voltage −Vc may be larger than an absolute value of the bias voltage Vb.

Next, when a gate voltage Vg1 is applied to the gate electrode 150, the power device 100 is turned on without current collapse (and/or with reduced current collapse).

In example embodiments, the point of time t1 of applying the negative control voltage −Vc may be earlier than a point of time t2 of applying the gate voltage Vg1. However, example embodiments are not limited thereto. For example, the point of time t2 of applying the gate voltage Vg1 and the point of time t1 of applying the negative control voltage −Vc may be coincident, or the point of time t2 of applying the gate voltage Vg1 may be later than the point of time t1 of applying the negative control voltage −Vc.

Figure 4:
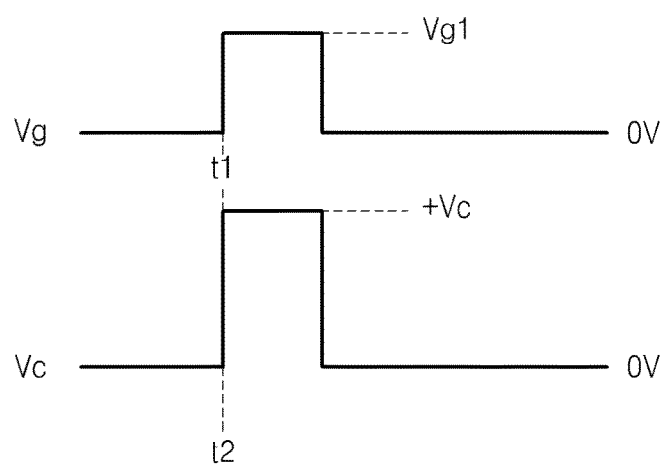

FIG. 4 is a timing diagram showing a method of operating the power device 100 of FIG. 1 to reduce current collapse thereof according to example embodiments.

Referring to FIG. 4, when the power device 100 is turned-on by applying a gate voltage Vg1 to the gate electrode 150, a positive control voltage +Vc is applied to the control electrode 170. The positive control voltage +Vc that is applied to the control electrode 170 moves electrons of the channel layer 120 to an electron depletion region of the 2DEG 122. This process may be referred to as channel enhancement. In this method, the control electrode 170 performs the same function as that of the gate electrode 150. The gate voltage Vg1 may be in a range from about 10 V to about 12 V, and the positive control voltage +Vc may be in a range from about 5 V to about 20 V. When the gate voltage Vg1 is applied to the gate electrode 150, the power device 100 may be turned on without current collapse.

In example embodiments, the point of time t1 of applying the positive control voltage +Vc and the point of time t2 of applying the gate voltage Vg1 may be coincident, but example embodiments are not limited thereto. For example, the point of time t1 of applying the positive control voltage +Vc may be earlier than the point of time t2 of applying the gate voltage Vg1, and also, the point of time t2 of applying the gate voltage Vg1 may be earlier than the point of time t1 of applying the positive control voltage +Vc.

In the method according to examples embodiments in FIG. 4, the trapping of electrons may be further repressed (and/or limited) by applying a ground voltage or a negative voltage, for example, a bias voltage in a range from about 0 V to about −20 V (refer to Vb of FIG. 3) to the control electrode 170 when the power device 100 is in a turned-off state, and a detailed description thereof will be repeated here.

Figure 5:
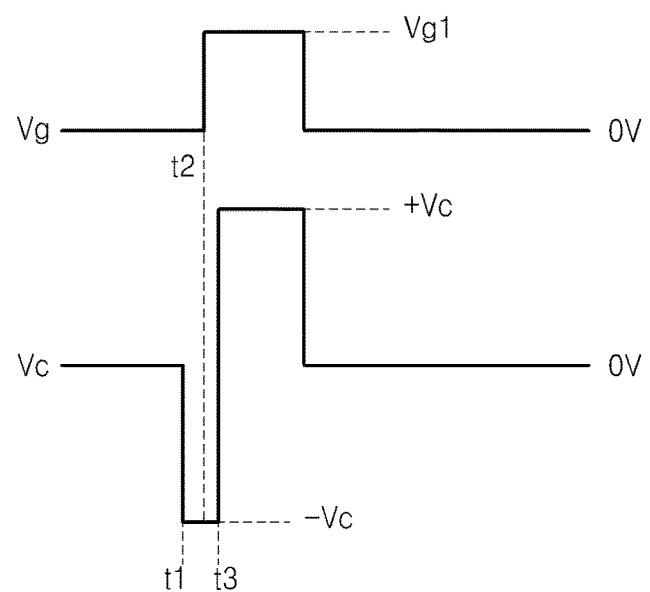

FIG. 5 is a timing diagram showing a method of operating the power device 100 of FIG. 1 to reduce current collapse thereof, according to example embodiments.

Referring to FIG. 5, a negative control voltage −Vc is applied to the control electrode 170 at the point of time T1 before the point of time T2 when the power device 100 is turned on by applying a gate voltage Vg1 to the gate electrode 150 of the power device 100. The negative control voltage −Vc that is applied to the control electrode 170 moves electrons trapped in the channel supply layer 130 to the channel layer 120, in particular, an electron depletion region of the 2DEG 122. This process may be referred to as a detrap process. The gate voltage Vg1 may be in a range from about 10 V to about 12 V, and the negative control voltage −Vc may be in a range from about −5 V to about −20V.

Next, a positive control voltage +Vc is applied to the control electrode 170 (refer to point of time T3) when the power device 100 is turned on by applying the gate voltage Vg1 to the gate electrode 150. The positive control voltage +Vc that is applied to the control electrode 170 moves electrons of the channel layer 120 to an electron depletion region of the 2DEG 122. This process may be referred to as a channel enhancement process. The application of the positive control voltage +Vc may be terminated simultaneously with a termination of the application of the gate voltage Vg1. The gate voltage Vg1 may be in a range from about 10 V to about 12 V, and the positive control voltage +Vc may be in a range from about 5 V to about 20 V. When the gate voltage Vg1 is applied to the gate electrode 150, the power device 100 is turned on without current collapse.

In example embodiments, the point of time T1 of applying the negative control voltage −Vc may be before the point of time T2 of applying the gate voltage Vg1, and the point of time T3 of applying the positive control voltage +Vc may be after the point of time T2 of applying the gate voltage Vg1, but example embodiments are not limited thereto. For example, the point of time T1 of applying the negative control voltage −Vc may be later than the point of time T2 of applying the gate voltage Vg1, or the point of time T2 of applying the gate voltage Vg1 and the point of time T3 of applying the positive control voltage +Vc may be coincident.

In the method according to example embodiments of FIG. 5, the electron trapping may be further repressed by applying a bias voltage (Vb of FIG. 3) in a range from about 0 V to about −20 V to the control electrode 170 in a state when the power device 100 is turned off, and descriptions thereof will be repeated here.

In the example embodiments described above, the power device 100 in which a control electrode is formed on a protective layer is described, but example embodiments are not limited thereto. For example, the control electrode may be formed on the channel supply layer 130 without the protective layer. Also, if the substrate 110 is a conductive substrate, the conductive substrate may be used as the control electrode. Also, the control electrode may be formed on a lower side of the channel layer 120 after removing the substrate 110 and the buffer layer 112.

Also, a channel depletion layer may further be formed on a lower side of the gate. Also, portions of the channel supply layer 130 and the channel layer 120 may have a recessed structure.

According to example embodiments, a control voltage that is separately applied to a control electrode from voltages applied to other electrodes is to generate a detrapping mode and/or a channel enhancement mode in which electrons are moved to an electron depletion region of the channel, thereby reducing current collapse. As a result, the resistance of a power device is reduced and the degradation of the power device due to heat may be reduced.

It should be understood that example embodiments described herein should be considered in a descriptive sense only and not for purposes of limitation. Descriptions of features or aspects within each method according to example embodiments should typically be considered as available for other similar features or aspects in other methods according to example embodiments. While some example embodiments have been particularly shown and described, it will be understood by one of ordinary skill in the art that variations in form and detail may be made therein without departing from the spirit and scope of the claims.

What is claimed is:

1. A method of operating a power device to reduce current collapse due to electrons trapped in a channel supply layer when the power device is changed to a turned-on state from a turned-off state, the method comprising: applying a control voltage to a control electrode of the power device, the control electrode being electrically separated from a source electrode, a drain electrode, and a gate electrode of the power device, the control voltage being separately applied to the control electrode; applying a gate voltage to the gate electrode, the applying the control voltage to the control electrode includes detrapping the electrons trapped in the channel supply layer by applying a negative control voltage to the control electrode, and the applying the negative control voltage being performed prior to the applying the gate voltage, and a duration of the applying the negative control voltage overlaps a duration of the applying the gate voltage; and applying a bias voltage of about 0 V to about −20 V to the control electrode when the power device is in the turned-off state, an absolute value of the bias voltage being smaller than an absolute value of the negative control voltage.

2. The method of claim 1, wherein a range of the negative control voltage is from about −5 V to about −20 V.

3. The method of claim 1, wherein the control electrode is between the gate electrode and the drain electrode.

4. The method of operating a power device to reduce current collapse due to electrons trapped in a channel supply layer when the power device is changed to a turned-on state from a turned-off state, the method comprising: applying a control voltage to a control electrode of the power device, the control electrode being electrically separated from a source electrode, a drain electrode, and a gate electrode of the power device, the control voltage being separately applied to the control electrode, the applying the control voltage including, applying a negative control voltage to the control electrode prior to applying a gate voltage to the gate electrode, applying a positive control voltage to the control electrode when the gate voltage is applied to the gate electrode, the applying the control voltage and the applying the gate voltage are terminated simultaneously, and the duration of applying the negative control voltage overlaps the duration of applying the gate voltage.

5. The method of claim 4, wherein the applying the negative control voltage and the applying positive control voltage are consecutively performed.

6. The method of claim 4, wherein the applying the gate voltage and the applying the positive control voltage are substantially performed at a same time.

7. The method of claim 4, further comprising:
applying a bias voltage a range from about 0 V to about −20 V to the control electrode when the power device is in the turned-off state, wherein an absolute value of the bias voltage is smaller than an absolute value of the negative control voltage.

* * * * *